United States Patent
Enkisch et al.

(10) Patent No.: US 10,598,921 B2
(45) Date of Patent: Mar. 24, 2020

(54) MIRROR ELEMENT, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Hartmut Enkisch, Aalen (DE); Martin Hermann, Heidenheim (DE); Christoph Nottbohm, Ulm (DE)

(73) Assignee: CARL ZEISS SMT GMBH, Oberkochen (DE)

(*) Notice: Subject to any disclaimer, the term of this patent is extended or adjusted under 35 U.S.C. 154(b) by 0 days.

(21) Appl. No.: 15/837,932

(22) Filed: Dec. 11, 2017

(65) Prior Publication Data

US 2018/0101002 A1    Apr. 12, 2018

Related U.S. Application Data

(63) Continuation of application No. 15/381,910, filed on Dec. 16, 2016, now abandoned.

(30) Foreign Application Priority Data

Dec. 16, 2015    (DE) .................. 10 2015 225 510

(51) Int. Cl.
*G03B 27/54*    (2006.01)
*G02B 26/08*    (2006.01)
(Continued)

(52) U.S. Cl.
CPC ....... *G02B 26/0833* (2013.01); *G02B 5/0816* (2013.01); *G02B 5/0891* (2013.01);
(Continued)

(58) Field of Classification Search
CPC ............. G03F 7/70075; G03F 7/70116; G03F 7/7015; G03F 7/70316; G03F 7/70891;
(Continued)

(56) References Cited

U.S. PATENT DOCUMENTS

| 6,994,444 B2 | 2/2006 | Puerto et al. |
| 2003/0186624 A1 | 10/2003 | Koike et al. |

(Continued)

FOREIGN PATENT DOCUMENTS

| DE | 10314212 A1 | 11/2003 |
| DE | 102006057567 A1 | 5/2008 |

(Continued)

OTHER PUBLICATIONS

H. Muro, H. Kaneko, S. Kiyota, P.J. French, "Stress analysis of SiO2/Si bi-metal effect in silicon accelerometers and its compensation" Sensors and Actuators A: Physical vol. 34, Iss. 1, Jul. 1992, pp. 43-49.

(Continued)

*Primary Examiner* — Peter B Kim
(74) *Attorney, Agent, or Firm* — Edell, Shapiro & Finnan, LLC

(57) ABSTRACT

A mirror element, in particular for a microlithographic projection exposure apparatus. According to one aspect, the mirror element includes a substrate (111, 112, 113, 114, 115, 211, 212, 213, 311a-311m, 411, 412, 413) and a layer stack (121, 122, 123, 124, 125, 221, 222, 223, 321a-321m, 421, 422, 423) on the substrate. The layer stack has at least one reflection layer system, wherein a curvature of the mirror element is generated on the basis of a setpoint curvature for a predetermined operating temperature by a non-vanishing bending force exerted by the layer stack, wherein the generated curvature varies by no more than 10% over a temperature interval ($\Delta T$) of at least 10 K.

19 Claims, 9 Drawing Sheets

(51) Int. Cl.
*G02B 7/18* (2006.01)
*G02B 5/08* (2006.01)
*G03F 7/20* (2006.01)
*G02B 5/09* (2006.01)
*G02B 5/10* (2006.01)

(52) U.S. Cl.
CPC ................ *G02B 5/09* (2013.01); *G02B 5/10* (2013.01); *G02B 7/181* (2013.01); *G03F 7/7015* (2013.01); *G03F 7/70075* (2013.01); *G03F 7/70116* (2013.01); *G03F 7/70316* (2013.01); *G03F 7/70891* (2013.01); *G03F 7/70958* (2013.01)

(58) Field of Classification Search
CPC . G03F 7/70958; G02B 26/0833; G02B 7/181; G02B 5/0816; G02B 5/0891; G02B 5/09; G02B 5/10
See application file for complete search history.

(56) References Cited

U.S. PATENT DOCUMENTS

| | | | |
|---|---|---|---|
| 2004/0057102 A1* | 3/2004 | Guo | B41J 2/465 359/290 |
| 2007/0195439 A1* | 8/2007 | DeNatale | G02B 7/181 359/871 |
| 2012/0314281 A1 | 12/2012 | Von Blanckenhagen | |
| 2013/0120863 A1 | 5/2013 | Kaller et al. | |
| 2016/0342093 A1 | 11/2016 | Enkisch et al. | |

FOREIGN PATENT DOCUMENTS

| | | |
|---|---|---|
| DE | 102006057568 A1 | 5/2008 |
| DE | 102008009600 A1 | 8/2009 |
| DE | 102008042212 A1 | 4/2010 |
| DE | 102010028488 A1 | 11/2011 |
| DE | 102010017106 A1 | 12/2011 |
| DE | 102011003357 A1 | 8/2012 |
| DE | 102014201622 A1 | 8/2015 |
| WO | 2005026843 A2 | 3/2005 |
| WO | 2007055401 A1 | 5/2007 |
| WO | 2008064879 A1 | 6/2008 |
| WO | 2008064880 A1 | 6/2008 |
| WO | 2009100856 A1 | 8/2009 |
| WO | 2012104136 A1 | 8/2012 |
| WO | 2015114043 A1 | 8/2015 |
| WO | 2016113117 A1 | 7/2016 |

OTHER PUBLICATIONS

IOP Science; Paper,"Stress anisotropy compensation of the sputter-deposited metal thin films by variable bias voltage"; Kourosh Khosraviani and Albert M Leung; Published Jun. 21, 2013; Journal of Micro-mechanics and Microengi-neering; vol. 23; No. 8.
Office Action in corresponding German Application 102015225510. 7, dated Jul. 15, 2016, along with English Translation.

* cited by examiner

MIRROR ELEMENT, IN PARTICULAR FOR A MICROLITHOGRAPHIC PROJECTION EXPOSURE APPARATUS

CROSS REFERENCE TO RELATED APPLICATIONS

This is a Continuation of U.S. application Ser. No. 15/381,910, filed Dec. 16, 2016, which claims foreign priority under 35 U.S.C. § 119(a)-(d) to German Application No. 10 2015 225 510.7 filed on Dec. 16, 2015 The entire contents of both applications are hereby incorporated into the present Continuation by reference.

FIELD OF THE INVENTION

The invention relates to a mirror element, in particular for a microlithographic projection exposure apparatus.

BACKGROUND

Microlithography is used for producing microstructured components, such as integrated circuits or LCDs, for example. The microlithography process is carried out in a so-called projection exposure apparatus comprising an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the extreme ultraviolet (EUV) range, i.e. at wavelengths of e.g. approximately 13 nm or approximately 7 nm, owing to the lack of availability of suitable light-transmissive refractive materials, mirrors are used as optical components for the imaging process.

In the illumination device of a microlithographic projection exposure apparatus designed for operation in the EUV range, in particular the use of facet mirrors in the form of field facet mirrors and pupil facet mirrors as focusing components is known for example from DE 10 2008 009 600 A1. Such facet mirrors are constructed from a multiplicity of individual mirrors or mirror facets, which may be designed to each be tiltable by way of flexure bearings for the purposes of adjusting, or else for realizing, specific illumination angle distributions. These mirror facets may comprise a plurality of micromirrors in turn.

Moreover, the use of mirror arrangements which comprise a multiplicity of mutually independently adjustable mirror elements in an illumination device of a microlithographic projection exposure apparatus, designed for operation at wavelengths in the very ultraviolet (VUV) range, for adjusting defined illumination settings (i.e. intensity distributions in a pupil plane of the illumination device) is also known, for example, from WO 2005/026843 A2.

In practice, there is a need during the production of mirror elements to adjust the respective refractive power thereof as exactly as possible, wherein this may be a refractive power of zero (corresponding to a plane mirror element) or else a refractive power differing from zero, depending on the application. A known approach to this end consists of using the mechanical tension generated when applying a layer stack, including the reflection layer system, onto a substrate and the bending force exerted on the substrate by the layer stack as a result thereof in a targeted manner when manufacturing the respective mirror element in order to generate a setpoint curvature of the mirror element—and hence a desired finite refractive power of the mirror element (wherein the substrate has a curvature deviating from the setpoint curvature of the mirror element prior to the formation of the layer stack).

A problem occurring in practice is that the mirror elements are exposed to temperature changes (both during the commissioning and during the subsequent running operation of the respective optical system). In the case of differing thermal expansions of the layer stack on the one hand and the substrate on the other hand (i.e. as a consequence of the so-called bimetallic effect), this produces an unwanted change in the curvature or refractive power of the respective mirror element and consequently may lead to a deterioration in the optical properties of the optical system comprising the mirror element.

Regarding the prior art, reference is made merely by way of example to WO 2015/114043 A1, DE 10 2010 028 488 A1 and DE 10 2006 057 567 A1.

SUMMARY

It is an object of the present invention to provide a mirror element, in particular for a microlithographic projection exposure apparatus, in which thermally induced changes in the refractive power of the mirror element resulting from temperature changes occurring during operation are at least reduced.

This object is achieved by the mirror element in accordance with the features of the independent claims.

In accordance with one aspect of the invention, a mirror element according to the invention, in particular for a microlithographic projection exposure apparatus, comprises:
  a substrate; and
  a layer stack on the substrate, wherein the layer stack has
    at least one reflection layer system;
    wherein a curvature of the mirror element is generated on
      the basis of a setpoint curvature for a predetermined
      operating temperature by a non-vanishing bending
      force exerted by the layer stack; and
    wherein the generated curvature varies by no more than
      10% over a temperature interval $\Delta T$ of at least 10 K.

In accordance with this aspect, the invention initially proceeds from the principle of using the mechanical tension generated when applying a layer stack, including the reflection layer system, onto a substrate and the bending force exerted on the substrate by the layer stack as a result thereof in a targeted manner in order to generate a setpoint curvature or refractive power of the mirror element (wherein the substrate has a curvature deviating from the setpoint curvature of the mirror element prior to the formation of the layer stack).

Now, the invention is based on the concept of designing the (overall) system made of substrate and layer stack in such a way that there is no significant variation in the curvature of the mirror element and hence no significant variation in the refractive power thereof any more, even in the case of a temperature change occurring at least within a restricted temperature interval, i.e. that an unwanted bimetallic effect is largely avoided at least over a restricted temperature range.

In accordance with one embodiment, the generated curvature varies by no more than 1%, in particular by no more than 0.1%, over a temperature interval ($\Delta T$) of at least 10 K.

In accordance with one embodiment, the mirror element comprises a compensation layer which at least partly compensates a variation of the bending force exerted by the layer stack accompanying a change in temperature occurring within the temperature interval in terms of the influence of said bending force on the curvature of the mirror element. In accordance with this approach, the compensation of the bimetallic effect according to the invention is therefore carried out by virtue of an additional layer being provided to this end, said layer—depending on the specific placement of this additional layer relative to the substrate and the layer stack in the overall structure—just exerting the bending force on the substrate which, in comparison with the bending force of the layer stack additionally induced by temperature change, is of the same magnitude or of the same magnitude with opposite sign such that, in the ideal case, a thermally induced change in the bending force of the layer stack is compensated and no thermally induced change in the curvature or refractive power occurs any more in the overall system or in the mirror element.

In accordance with one embodiment, the mirror element comprises an equalization layer which reduces a transfer of mechanical tension between the layer stack and the substrate compared to an analogous design without the equalization layer. According to this approach, the compensation of the bimetallic effect according to the invention therefore occurs by virtue of mechanical decoupling between the layer stack and substrate being provided by way of a "soft" equalization layer.

In accordance with one embodiment, the mirror element is embodied in such a way that a mean coefficient of thermal expansion of the substrate has a first value and a mean coefficient of thermal expansion of the layer stack has a second value, wherein the first value and the second value correspond to within ±10%, in particular to within ±3%, more particularly to within ±1%, in each case in relation to the larger one of the two values.

According to this approach, the compensation of the bimetallic effect according to the invention therefore occurs by virtue of adapting the configuration of the substrate in view of the material used in the substrate or the materials used in the substrate to the configuration of the layer stack in respect of the respective mean coefficient of thermal expansion.

In accordance with one embodiment, the substrate is produced from at least two different materials.

The invention is not restricted to the application of the principle, set forth at the outset, of using a bending force exerted by the layer stack on the substrate in a targeted manner in order to generate a setpoint curvature or refractive power of the mirror element (wherein the substrate has a curvature deviating from the setpoint curvature of the mirror element prior to forming the layer stack). Rather, the invention may also be applied to mirror elements in which the substrate is manufactured from the outset with substantially a setpoint curvature, with in this case a bending force exerted by the layer stack on the substrate (for example due to a comparatively large substrate thickness) being only very small. This is because the effect (to be compensated according to the invention) of different thermal expansion of layer stack and substrate or of an unwanted change in the curvature or refractive power of the mirror element caused thereby may even still be serious enough in such applications—which may include e.g. the mirror elements of facet mirrors, specified at the outset, such as e.g. field or pupil facet mirrors—to cause a significant impairment of the optical properties during the operation of e.g. a microlithographic projection exposure apparatus.

The invention therefore further relates to a mirror element, in particular for a microlithographic projection exposure apparatus, comprising:
  a substrate;
  a layer stack on the substrate, wherein the layer stack has at least one reflection layer system; and
  an equalization layer which reduces a transfer of mechanical tension between the layer stack and the substrate compared to an analogous design without the equalization layer.

In accordance with one embodiment, the mirror element comprises an additional tension-inducing layer. This additional tension-inducing layer may be configured in a targeted manner in such a way that, overall, a desired mechanical tension or a desired bending force exerted by the layer stack on the substrate is achieved.

In accordance with one embodiment, the mirror element is a mirror element of a mirror arrangement composed of a plurality of mirror elements. In particular, these mirror elements may be tiltable independently of one another.

As a matter of principle, the invention is not restricted to certain dimensions of the respective mirror elements. Thus, for example, the mirror elements may be so-called MEMS components, the dimensions of which may, merely by way of example, lie in the region of 50 μm thickness and 1 mm edge length, or else comparatively macroscopic mirror elements, for example of a facet mirror, with e.g. several millimetres (mm) thickness and e.g. 100 mm edge length.

In accordance with one embodiment, the mirror arrangement is a facet mirror, in particular a field facet mirror or a pupil facet mirror.

In accordance with one embodiment, the mirror element is designed for an operating wavelength of less than 30 nm, in particular less than 15 nm. However, the invention is not restricted thereto, and so the mirror element may also be designed for a wavelength in the VUV range, in particular a wavelength of less than 200 nm, in further applications.

In accordance with one embodiment, the mirror element is a mirror element of a microlithographic projection exposure apparatus. However, the invention is not restricted thereto; rather, it is also realizable for example in measurement constructions which, in particular, may be designed for operation in EUV.

The invention furthermore relates to an optical system of a microlithographic projection exposure apparatus, in particular an illumination device or a projection lens, and to a microlithographic projection exposure apparatus.

Further configurations of the invention may be gathered from the description and the dependent claims.

The invention is explained in greater detail below on the basis of exemplary embodiments illustrated in the accompanying figures.

BRIEF DESCRIPTION OF THE DRAWINGS

In the figures.

DETAILED DESCRIPTION

Various embodiments of a mirror element according to the invention are initially described below with reference to FIGS. 1-5.

The produced mirror elements may be e.g. mirror elements or micromirrors of a mirror arrangement in the form of a field facet mirror (without the invention being restricted thereto), wherein the individual mirror elements may have identical or else differing curvatures or refractive powers.

In all embodiments, a layer stack, which has a reflection layer system (e.g. as a multiple layer system made of molybdenum and silicon layers), is applied onto a respective substrate. The mirror substrate material may be, for example, silicon (Si) or quartz glass doped with titanium dioxide ($TiO_2$), with examples of materials that are usable being those sold under the trade names ULE® (by Corning Inc.) or Zerodur® (by Schott AG). In further embodiments, the mirror substrate material may also comprise germanium (Ge), diamond, gallium arsenide (GaAs), gallium nitride (GaN), gallium antimonide (GaSb), gallium phosphide (GaP), $Al_2O_3$, indium phosphide (InP), indium arsenide (InAs), indium antimonide (InSb), calcium fluoride ($CaF_2$), zinc oxide (ZnO) or silicon carbide (SiC). Optionally, further functional layers, such as e.g. a capping layer ("cap layer"), a substrate protection layer, etc., can be provided in a manner known per se.

Here, a bending force of the layer stack different from zero may be exerted on the substrate in each case when forming the layer stack comprising the reflection layer system by way of a suitable adjustment of the coating parameters and/or the parameters of a post-treatment and the mechanical tension generated thereby. Here, the mechanical tension when forming the respective layer stack may be set in a manner known per se by virtue of materials and thickness ratios (e.g. the ratio of the absorber ply thickness to the overall thickness of a period, wherein this thickness ratio is also referred to as Γ) being set in the desired manner in the reflection layer system in particular. The procedure when setting a mechanical tension is known to a person skilled in the art, for example, from DE 10 2008 042 212 A1. Moreover, the mechanical tension may also be set when applying the respective layer stack by oxygen doping or the addition of oxygen during the coating, as is known to a person skilled in the art from DE 10 2011 003 357 A1.

Figure 5A:
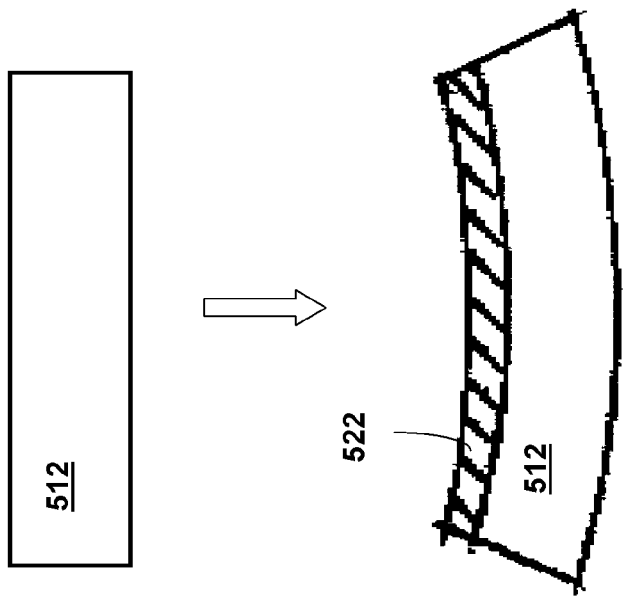
FIGS. 5A-5B show schematic illustrations for explaining the effect of mechanical tension resulting in curvature of substrates following application of respective layer systems.
Figure 5A:
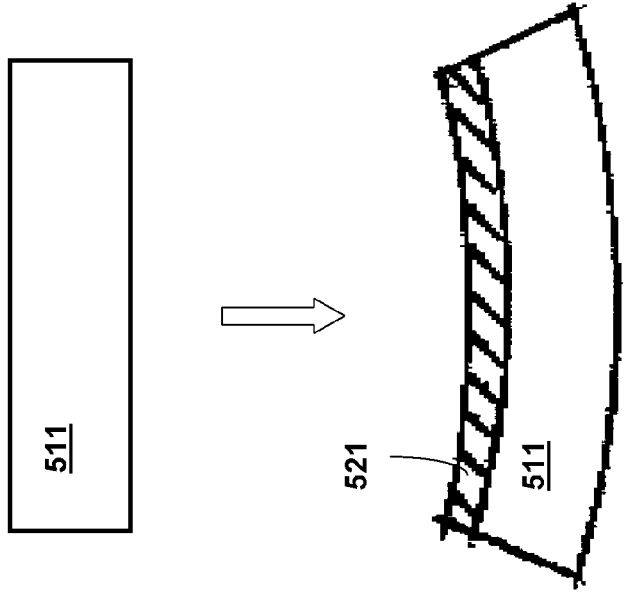
Figure 5B:
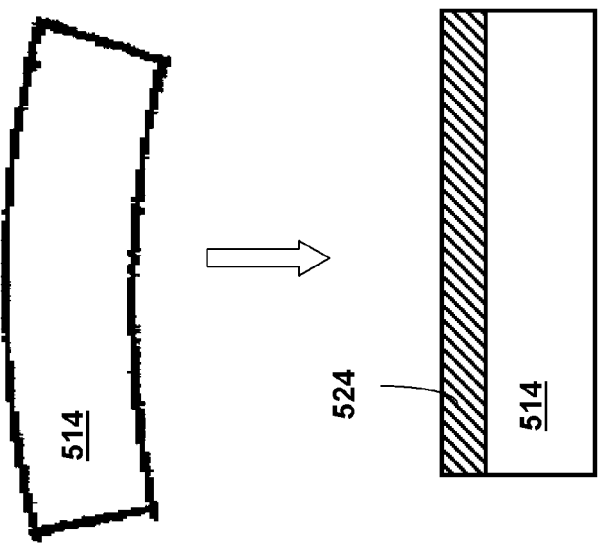
Figure 5B:
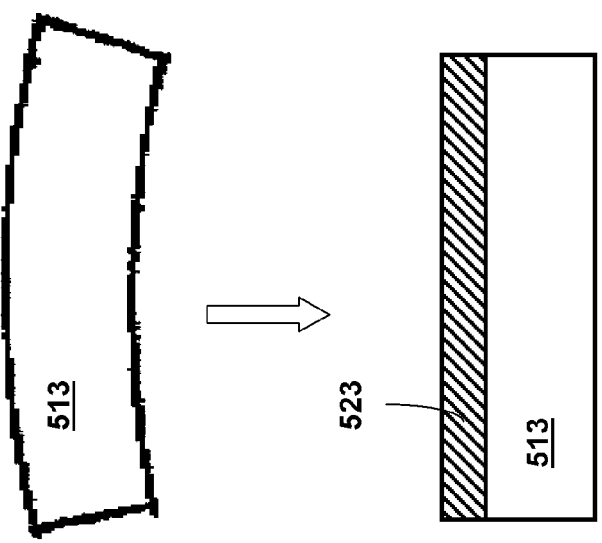

This mechanical tension generated on the substrate during the formation of the layer stack comprising the reflection layer system leads to the curvature of the substrate changing in comparison with the original curvature which was present in the state prior to the coating. Either said original curvature of the substrate in the state prior to the coating may equal zero (i.e. the substrate is plane prior to the coating) or the original curvature may correspond to a finite curvature (e.g. a curvature coating) not yet corresponding to the setpoint curvature of the completed mirror element. In accordance with FIG. 5A, e.g. a plurality of mirror elements with the same curvature or refractive power can be produced by virtue of plane (mirror) substrates 511, 512, . . . , in each case with a layer stack 521, 522, . . . comprising a reflection layer system being coated in the initial state, with identical coating parameters being set in each case. During this coating, the generated mechanical tension and the bending force on the respective substrate 511, 522, . . . resulting therefrom are selected in such a way that the desired curvature (identical in each case for the individual mirror elements) is set in the respective completed mirror element. In accordance with FIG. 5B, the respective substrates 513, 514, . . . can also have a finite curvature in the initial state (prior to the coating), said finite curvature not yet corresponding to the ultimately desired curvature. This substrate curvature is then changed by the mechanical tension generated when applying the layer stack or by the exerted bending force. Specifically, a convex curvature of the substrates 513, 514, . . . present in the initial state prior to the coating in the example of FIG. 5B is brought to zero; that is to say, a plane geometry of the completed mirror elements is ultimately generated.

Below, various embodiments of a mirror element according to the invention are now explained with reference to FIGS. 1A-1E. Therein, the compensation according to the invention of the "bimetallic effect", i.e. the compensation of a variation of the bending force exerted by the layer stack accompanying a temperature change, in terms of the influence thereof on the curvature of the mirror element, is obtained by suitable adaptation of the configuration of the substrate to the configuration of the layer stack, in particular with regard to the respectively present mean coefficient of thermal expansion.

Specifically, in accordance with FIGS. 1A-1E, the substrate in a respective mirror element 110a-110e is designed in view of the material used in the substrate or in view of the materials used in the substrate. This is done in such a way that the mean coefficient of thermal expansion of the substrate substantially corresponds in terms of the value thereof to the mean coefficient of thermal expansion of the layer stack (preferably to within ±3% in relation to the larger of the two values).

By virtue of the measures according to the invention adopted here with respect to the sought-after correspondence of the mean coefficients of thermal expansion between the layer stack on the one hand and the substrate on the other hand being adopted on the part of the substrate, the circumstances that material selection and design are not predetermined by the desired optical effect of the mirror element on the part of the substrate—unlike in the case of the layer stack or the reflection layer system—are employed such that there is thus a comparatively large design freedom on the part of the substrate.

Figure 1A:
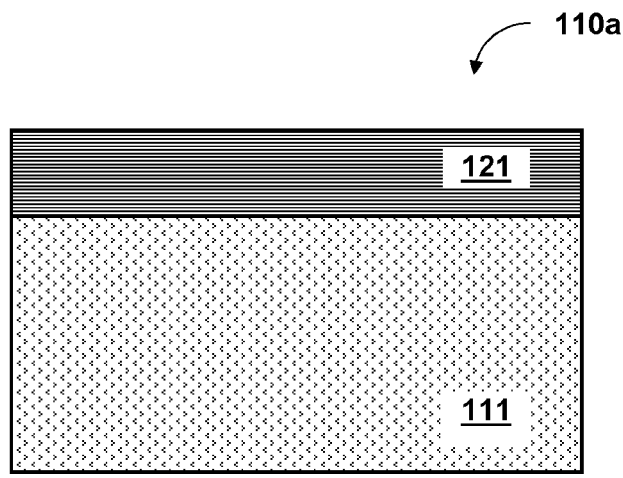
FIGS. 1A-1E show schematic illustrations for explaining various embodiments using respectively different materials and/or configurations in the substrate of a mirror element according to the invention.
Figure 1B:
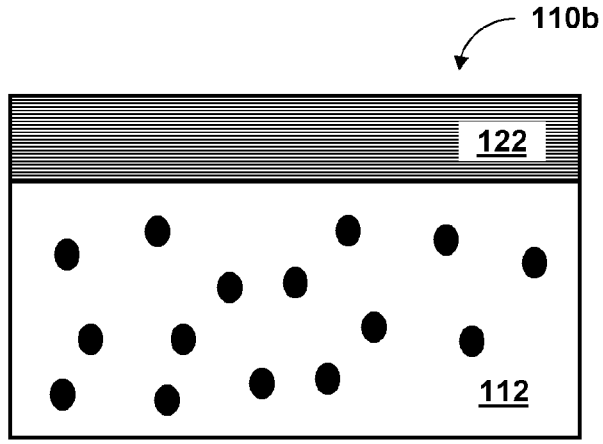
Figure 1C:
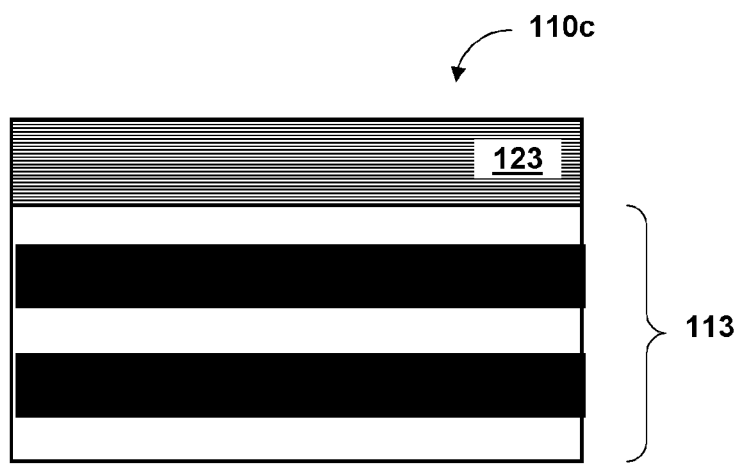
Figure 1D:
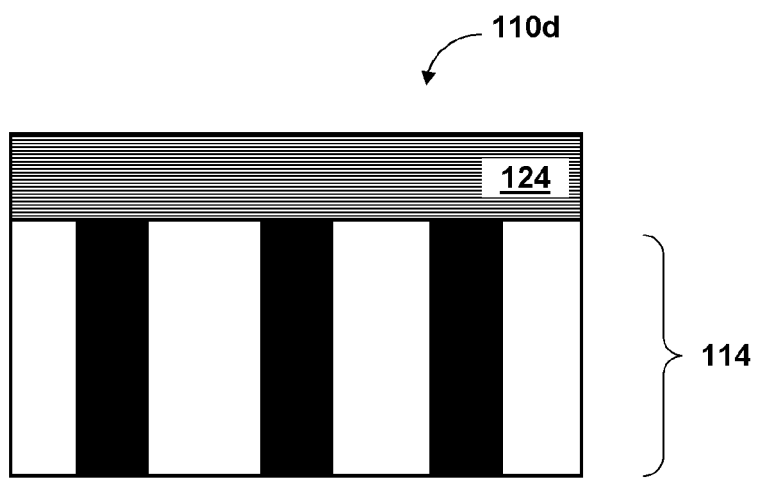
Figure 1E:
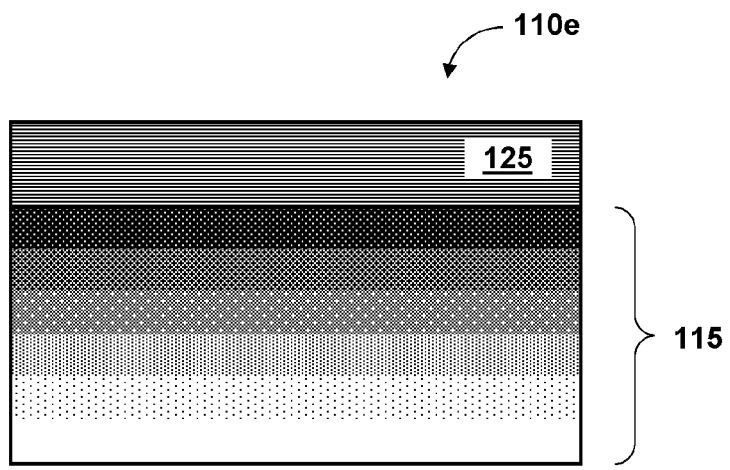

As indicated schematically in each case in FIGS. 1A-1E, the above-described adaptation of the substrate (in each case denoted by 111, 112, 113, 114 and 115 in FIGS. 1A-1E) to the layer stack (in each case denoted by 121, 122, 123, 124 and 125 in FIGS. 1A-1E) may be carried out by virtue of the fact that the substrate material already has the suitable mean coefficient of thermal expansion substantially corresponding to the value in the respective layer stack, as illustrated in FIG. 1A for the case of a homogeneous configuration of the substrate. Alternatively, this correspondence on the part of the substrate can be achieved by doping with a further material with a deviating coefficient of thermal expansion, as illustrated in FIG. 1B. According to further variants, the correspondence can be achieved through layers (FIG. 1C) or columns (FIG. 1D) of a further material with a deviating coefficient of thermal expansion. FIG. 1E shows a schematic illustration of a further embodiment, in which the mixture of different substrate materials selected for the substrate 115 is distributed among a plurality of layers such that, as a result, a gradient emerges in the coefficient of thermal expansion.

If, for example, the layer stack 122 in FIG. 1B has a mean coefficient of thermal expansion of $5*10^{-6}K^{-1}$, the desired correspondence of the coefficient of thermal expansion present on the part of the substrate 112 may be achieved by virtue of the substrate 112 being configured as an alloy made of silicon (Si) and germanium (Ge). If the corresponding values of the coefficient of thermal expansion for silicon ($\alpha=2.6*10^{-6}K^{-1}$) and germanium ($\alpha=5.9*10^{-6}K^{-1}$) are taken into account, an ideal silicon (Si) content of 27% emerges for the exemplary embodiment. To a first approximation, this also applies to the exemplary embodiments in accordance with FIG. 1C and FIG. 1D.

In accordance with the above-described aspect, the invention therefore contains the concept of appropriately selecting the coefficient of thermal expansion of the substrate (as "free" parameter) in the case of a predetermined value of the coefficient of thermal expansion for the layer stack in order, as a result, to obtain the desired compensation effect.

Below, further exemplary embodiments are described with reference to FIGS. 2-4, in which the compensation of the bimetallic effect according to the invention is not only achieved by an appropriate adaptation of the substrate or substrate material, but by the use of one or more additional layers.

Figure 2A:
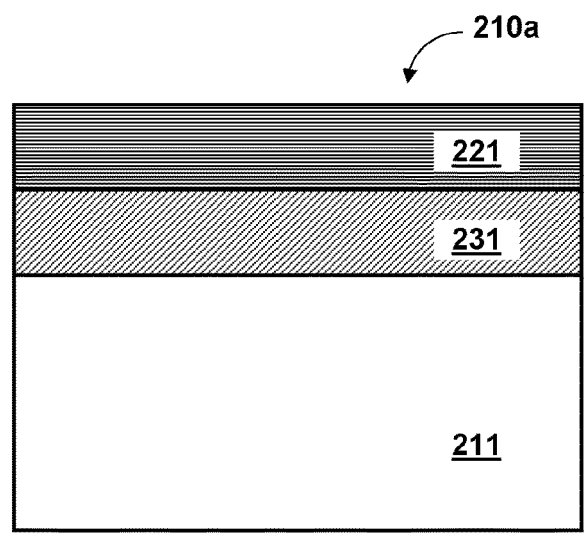
FIGS. 2A-2C show schematic illustrations for explaining various embodiments of a mirror element according to the invention using respective additional layers.
Figure 2B:
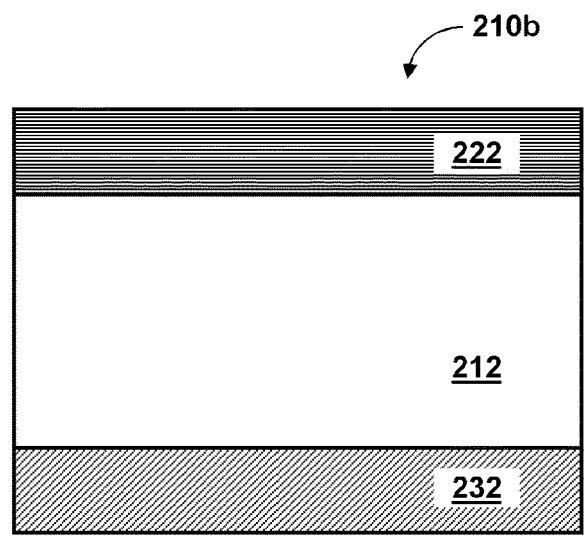
Figure 2C:
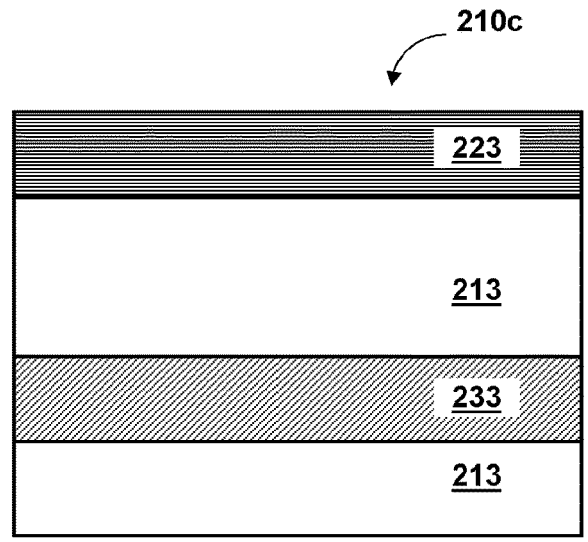

In accordance with FIGS. 2A-2C, the substrate is once again initially denoted by 211, 212 or 213 and the layer stack (which comprises a reflection layer system and, optionally, further functional layers) is denoted by 221, 222 or 223. What is common to the exemplary embodiments of FIGS. 2A-2C is that the respective mirror element has a compensation layer 231, 232 or 233 which serves to at least partly compensate the variation of the bending force exerted by the layer stack 221, 222 or 223 accompanying a temperature change, in terms of the influence thereof on the curvature of the respective mirror element 210a, 210b or 210c.

Here, the compensation layer 231 is arranged between substrate 211 and layer stack 221 in accordance with FIG. 2A. In this case, the compensation layer 231 is configured in such a way that the variation of the bending force exerted by the compensation layer 231 accompanying a temperature change within a temperature interval of e.g. at least 10 K is just equal in terms of magnitude but with opposite sign to the change of the bending force on the part of the layer stack 221 which is thermally induced by this temperature change. In other words, the following relationship holds true:

$$(\alpha_{Substrate}-\alpha_{layer\ stack})*t_{f1}=-(\alpha_{Substrate}-\alpha_{compensation\ layer})*t_{f2}$$

where $t_{f1}$ and $t_{f2}$ each denote the thicknesses of layer stack 221 and compensation layer 231 and wherein, in each case, a correspondence of the biaxial moduli or Poisson numbers of substrate 211, layer stack 221 and compensation layer 231 was assumed.

By way of example, in the case of a mean coefficient of thermal expansion on the part of the layer stack 221 of $\alpha=5*10^{-6}K^{-1}$ in the case of a thickness of the layer stack 221 of 500 nm and in the case of a substrate 211 made of silicon (Si) with a coefficient of thermal expansion of $\alpha=2.6*10^{-6}K^{-1}$, the compensation layer 231 may be produced from silicon dioxide ($SiO_2$) with a coefficient of thermal expansion of $0.55*10^{-6}K^{-1}$, wherein the thickness of the compensation layer 231 in this case has an ideal value of 585 nm.

In accordance with this aspect, the invention therefore contains the concept of selecting the corresponding parameters of the compensation layer with a corresponding fit when proceeding from predetermined values for the coefficient of thermal expansion a of the substrate and of the layer stack and for the thickness of the layer stack in order, as a result, to obtain the desired compensation effect. In other words, the introduction of the compensation layer facilitates achieving the desired compensation effect by the targeted configuration of the compensation layer (in respect of material and thickness) while maintaining the predetermined parameters in Equation (1), namely $\alpha_{Substrate}$, $\alpha_{layer\ stack}$ and $t_{f1}$.

In accordance with FIG. 2B, the compensation layer 232 may also be arranged on the side of the substrate 212 facing away from the layer stack 222. In this case, the bending force of the compensation layer 232 which is thermally induced by the above-described temperature change within a specific temperature interval is preferably ideally equal to the bending force exerted by the layer stack 222 in terms of magnitude and sign, i.e. the following applies:

$$(\alpha_{Substrate}-\alpha_{layer\ stack})*t_{f1}=(\alpha_{Substrate}-\alpha_{compensation\ layer})*t_{f2}$$

In the case of a configuration of substrate 212 and layer stack 222 corresponding to FIG. 2B, this may be achieved by a compensation layer 232 made of aluminium (Al) with a coefficient of thermal expansion of $23*10K^{-1}$ in the case of an ideal thickness of the compensation layer 232 of 59 nm.

In accordance with FIG. 2C, the compensation layer 233 may further also be arranged within the substrate 213 (i.e. neither on the upper nor lower side thereof).

In further embodiments depicted schematically in FIGS. 3A-3M, an additional tension-inducing layer may be provided, the latter being configured in a targeted manner such that, as a result, a desired mechanical tension or a desired bending force exerted by the layer stack on the substrate is achieved. Here, in FIGS. 3a-3m, the substrate is respectively denoted by 311a, 311b, ..., the layer stack is respectively denoted by 321a, 321b, ... and the optionally additionally present compensation layer is respectively denoted by 351b, 351c, ....

Figure 3A:
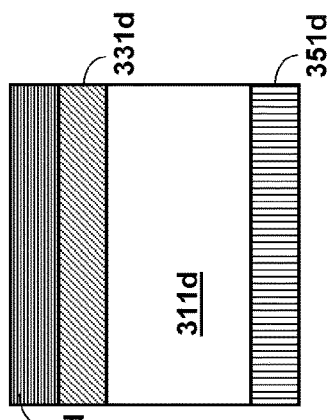
FIGS. 3A-3M show schematic illustrations for explaining various embodiments of a mirror element according to the invention using respective additional tension-inducing layers.
Figure 3B:
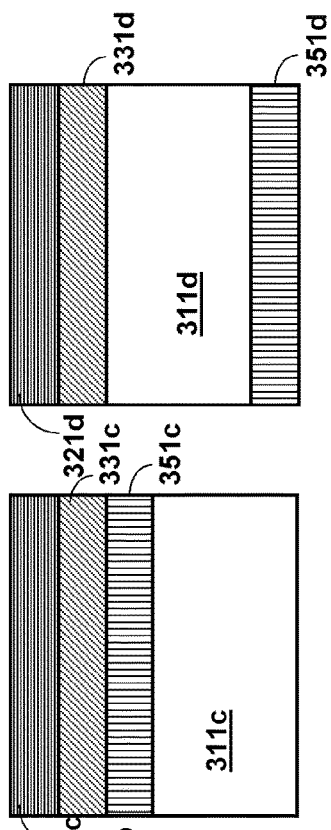
Figure 3C:
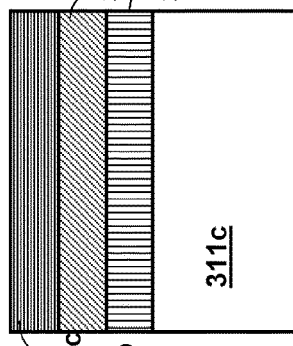
Figure 3D:
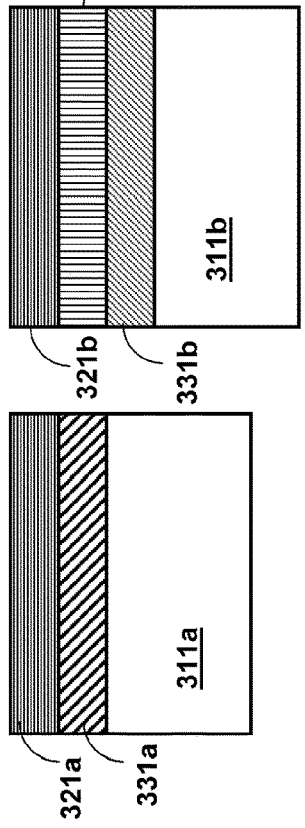
Figure 3E:
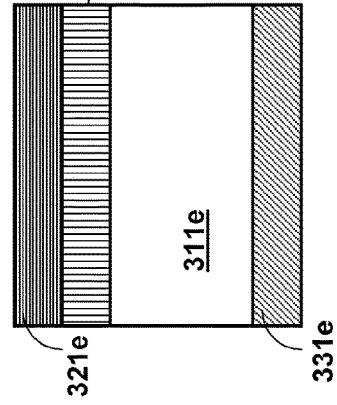
Figure 3F:
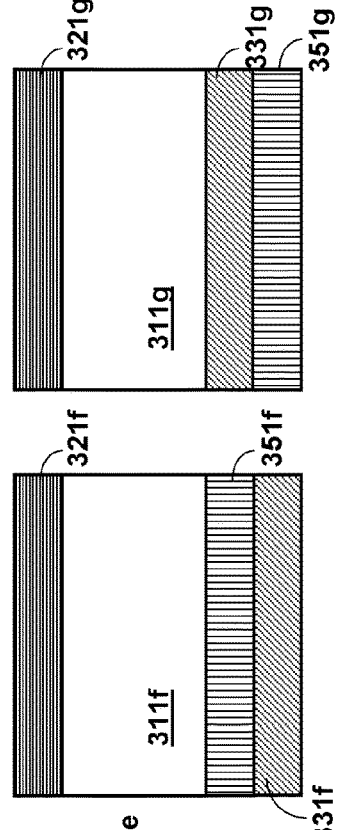
Figure 3G:
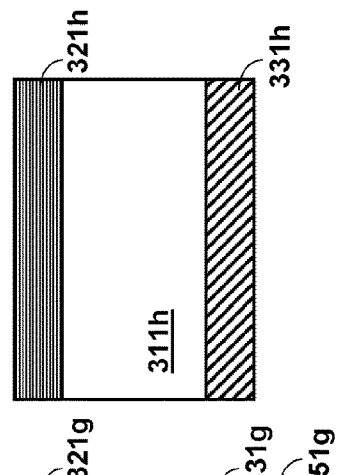
Figure 3H:
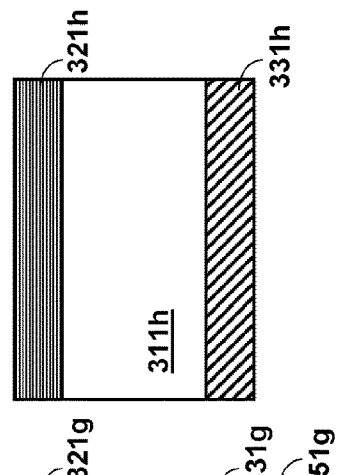
Figure 3K:
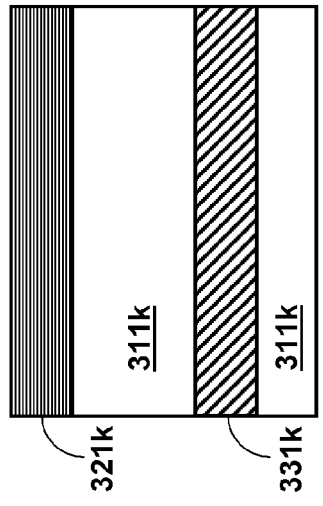
Figure 3J:
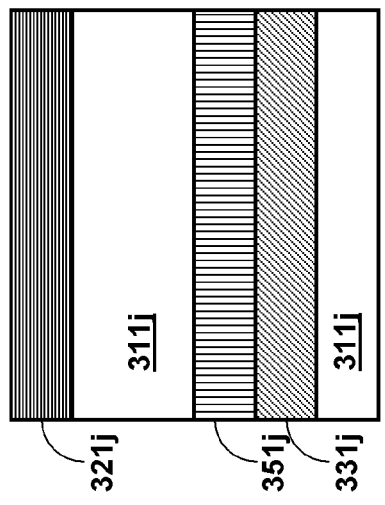
Figure 3I:
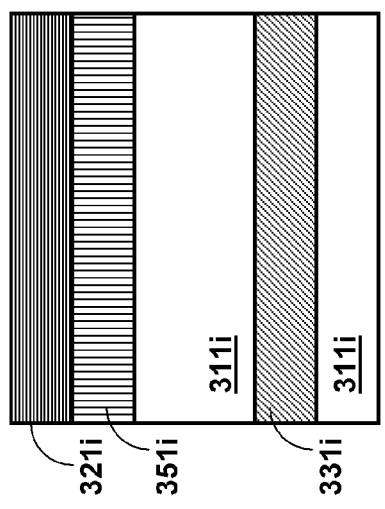
Figure 3M:
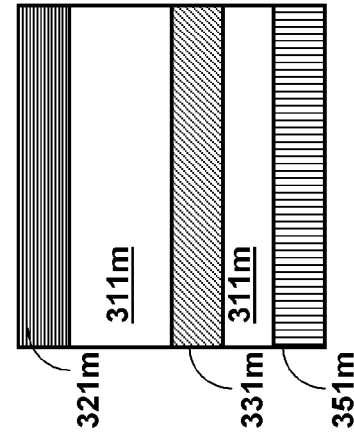
Figure 3L:
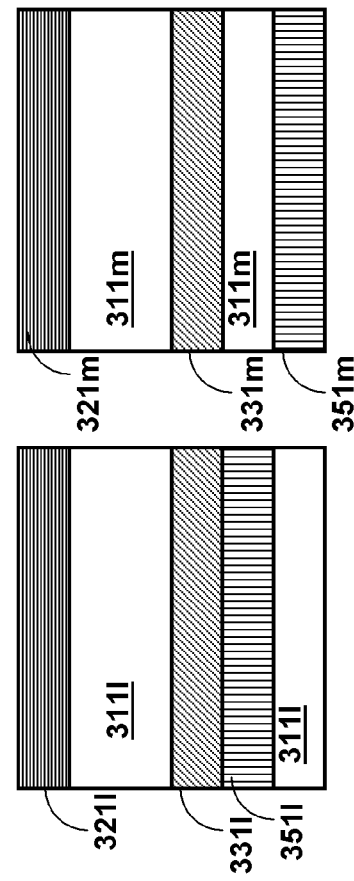

While the assumption is respectively made in accordance with FIGS. 3A, 3H and 3K that the relevant adaptation of the mechanical tension achieved overall or of the bending force exerted by the layer stack 321a, 321h or 321k is achieved by the compensation layer 331a, 331h or 331k itself, an additional tension-inducing layer 351b, 351c, ... is provided in each case in the remaining embodiments in accordance with FIGS. 3B-3G, FIGS. 3I-3J and FIGS. 3L-3M, wherein the variants emerging from the embodiments described above on the basis of FIGS. 2A-2C are schematically presented in detail.

Figure 4A:
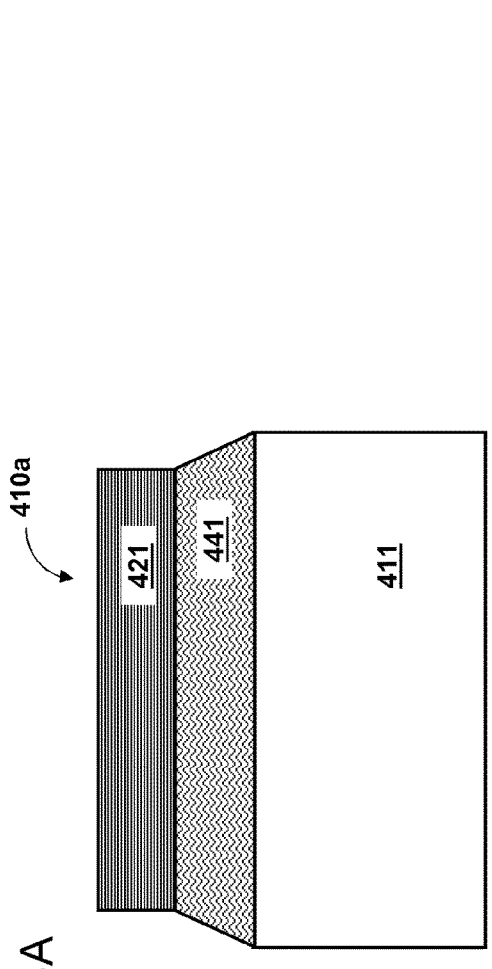
FIGS. 4A-4C show schematic illustrations for explaining various embodiments of a mirror element according to the invention using an equalization layer (FIG. 4A) or an additional tension-inducing layer (FIG. 4B and FIG. 4C)

FIG. 4A shows a further embodiment of the invention, in which the compensation of the bimetallic effect according to the invention is achieved by virtue of an equalization layer 441 being present, which reduces a transfer of mechanical tension between the substrate 411 and the layer stack 421 (such that the equalization layer 441 in this respect causes mechanical decoupling between the substrate 411 and layer stack 421).

Figure 4C:
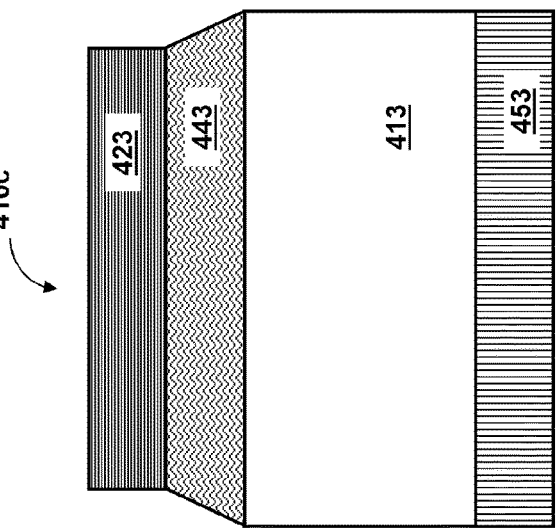
Figure 4B:
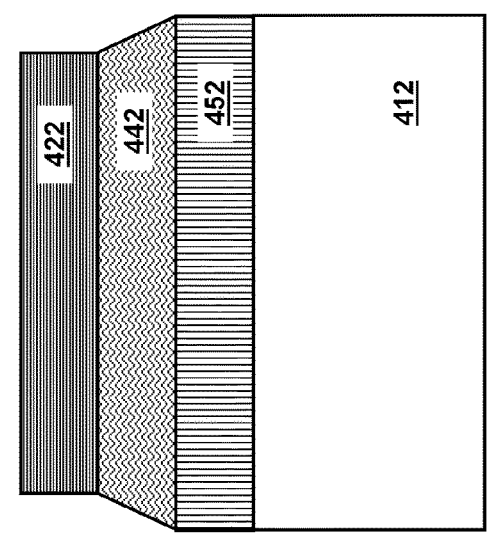

FIG. 4B and FIG. 4C show further exemplary embodiments in which, analogous to FIGS. 3A-3M, an additional tension-inducing layer 452 or 453 is provided.

Figure 6:
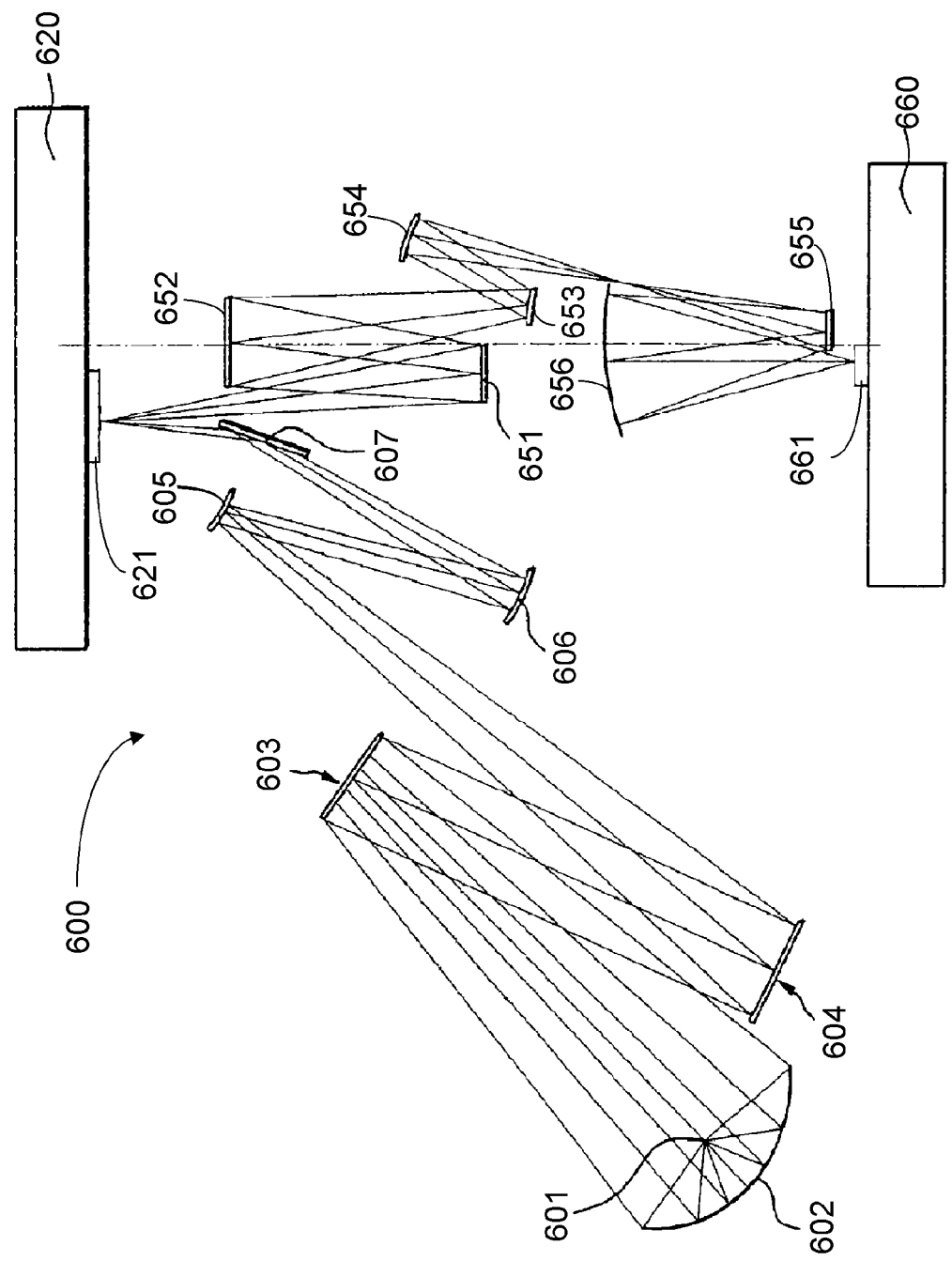
FIG. 6 shows a schematic illustration for explaining a representative construction of a microlithographic projection exposure apparatus designed for operation in EUV.

FIG. 6 shows a schematic illustration of one exemplary projection exposure apparatus which is designed for operation in the EUV range and in which the present invention may be realized.

According to FIG. 6, an illumination device in a projection exposure apparatus 600 designed for EUV radiation comprises a field facet mirror 603 and a pupil facet mirror 604. The light from a light source unit comprising a plasma light source 601 and a collector mirror 602 is directed onto the field facet mirror 603. A first telescope mirror 605 and a second telescope mirror 606 are arranged in the light path downstream of the pupil facet mirror 604. A deflection mirror 607 is arranged downstream in the light path, said deflection mirror directing the radiation that is incident on it onto an object field in the object plane of a projection lens comprising six mirrors 651-656. Arranged on a mask stage 620 at the location of the object field is a reflective structure-bearing mask 621, which with the aid of the projection lens is imaged into an image plane, in which there is a substrate 661 coated with a light-sensitive layer (photoresist) on a wafer stage 660.

Without the invention being restricted thereto, the method according to the invention is applicable in a particularly advantageous manner to the manufacture of the pupil facet mirror 603 or of the pupil facet mirror 604 from FIG. 6; further particularly if the individual field facets of the field facet mirror 603 or the individual pupil facets of the pupil facet mirror 604 in turn are composed of individual mirror elements or micromirrors.

Even though the invention has been described on the basis of specific embodiments, numerous variations and alternative embodiments will be evident to the person skilled in the art, e.g. through combination and/or exchange of features of individual embodiments. Accordingly, such variations and alternative embodiments are concomitantly encompassed by the present invention, and the scope of the invention is restricted only within the meaning of the appended patent claims and equivalents thereof.

What is claimed is:

1. A mirror element, comprising:
   a substrate;
   a layer stack on the substrate, wherein the layer stack has at least one reflection layer system configured to reflect radiation in the extreme ultraviolet (EUV) range, and wherein the layer stack exerts a temperature dependent non-zero first bending force on the substrate to generate a non-zero tension in the substrate resulting in a curvature of the mirror element;
   a compensation layer, wherein the compensation layer exerts a second bending force on the substrate; and
   a tension-inducing layer wherein the tension-inducing layer exerts a third bending force on the substrate;
   wherein the curvature of the mirror element is generated on a basis of a setpoint curvature for a predetermined operating temperature by the temperature dependent non-zero first bending force exerted by the layer stack;
   wherein a sum of the second bending force, the third bending force and the temperature dependent non-zero first bending force results in a non-zero net force such that the generated curvature varies by no more than 10% over a temperature interval ($\Delta T$) of at least 10 K; and
   wherein the tension inducing layer is separated from the compensation layer by the substrate.

2. The mirror element according to claim 1, wherein the generated curvature varies by no more than 1% over a temperature interval ($\Delta T$) of at least 10 K.

3. The mirror element according to claim 2, wherein the generated curvature varies by no more than 0.1% over a temperature interval ($\Delta T$) of at least 10 K.

4. The mirror element according to claim 1, wherein a mean coefficient of thermal expansion of the substrate has a first value and a mean coefficient of thermal expansion of the layer stack has a second value, wherein the first value and the second value correspond to within ±10% in relation to the larger one of the two values.

5. The mirror element according to claim 4, wherein the substrate is produced from at least two different materials.

6. The mirror element according to claim 4, wherein the first value and the second value correspond to within ±1%, in relation to the larger one of the two values.

7. The mirror element according to claim 1, configured for operation in a microlithographic projection exposure apparatus.

8. The mirror element according to claim 1, wherein the layer stack comprises molybdenum and silicon layers.

9. The mirror element according to claim 1, wherein the compensation layer is arranged between the layer stack and the substrate.

10. A mirror arrangement comprising:
    a plurality of mirror elements, each said mirror element comprising:
       a substrate;
       a layer stack on the substrate, wherein the layer stack has at least one reflection layer system configured to reflect radiation in the extreme ultraviolet (EUV) range, and wherein the layer stack exerts a temperature dependent non-zero first bending force on the substrate to generate a non-zero tension in the substrate resulting in a curvature of the mirror element;
       a compensation layer, wherein the compensation layer exerts a second bending force on the substrate; and
       a tension-inducing layer wherein the tension-inducing layer exerts a third bending force on the substrate;
       wherein the curvature of the mirror element is generated on a basis of a setpoint curvature for a predetermined operating temperature by the temperature dependent non-zero first bending force exerted by the layer stack;
       wherein a sum of the second bending force, the third bending force and the temperature dependent non-zero first bending force results in a non-zero net force such that the generated curvature varies by no more than 10% over a temperature interval ($\Delta T$) of at least 10 K; and
       wherein the tension inducing layer is separated from the compensation layer by the substrate.

11. The mirror arrangement according to claim 10, wherein the mirror elements are configured to tilt independently of one another.

12. The mirror arrangement according to claim 10, wherein the mirror arrangement is a facet mirror comprising the mirror elements.

13. The mirror arrangement according to claim 12, wherein the facet mirror is configured as a field facet mirror or as a pupil facet mirror.

14. The mirror arrangement according to claim 10, configured for an operating wavelength of less than 30 nm.

15. The mirror arrangement according to claim 10, configured for operation in a microlithographic projection exposure apparatus.

16. An optical system of a microlithographic projection exposure apparatus, comprising at least one mirror arrangement according to claim 15.

17. A microlithographic projection exposure apparatus comprising an illumination device and a projection lens, wherein the illumination device or the projection lens comprises the mirror arrangement according to claim 15.

18. The mirror arrangement according to claim 10, configured for operation in a microlithographic projection exposure apparatus.

19. The mirror arrangement according to claim 10, wherein the layer stack comprises molybdenum and silicon layers.

* * * * *

UNITED STATES PATENT AND TRADEMARK OFFICE
CERTIFICATE OF CORRECTION

PATENT NO. : 10,598,921 B2  
APPLICATION NO. : 15/837932  
DATED : March 24, 2020  
INVENTOR(S) : Hartmut Enkisch et al.

It is certified that error appears in the above-identified patent and that said Letters Patent is hereby corrected as shown below:

On the Title Page

Page 2, Column 2, item (56), under "OTHER PUBLICATIONS", Line 4, Delete "Microengi-neering;" and insert -- Micro-engineering; --, therefor.

In the Specification

Column 1, Line 11, Delete "2015 The" and insert -- 2015. The --, therefor.

Column 8, Line 8, Delete "a" and insert -- α --, therefor.

Column 8, Line 31, Delete "23*10K$^{-1}$" and insert -- 23*10$^{-6}$K$^{-1}$ --, therefor.

Column 8, Line 41, Delete "3a-3m," and insert -- 3A-3M, --, therefor.

Signed and Sealed this  
Twenty-seventh Day of October, 2020

Andrei Iancu  
*Director of the United States Patent and Trademark Office*